(12) United States Patent
Wu

(10) Patent No.: US 12,167,704 B2
(45) Date of Patent: Dec. 10, 2024

(54) MEMORY DEVICES AND METHODS OF FORMING THE SAME

(71) Applicant: Taiwan Semiconductor Manufacturing Company, Ltd., Hsinchu (TW)

(72) Inventor: Chao-I Wu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/349,181

(22) Filed: Jul. 10, 2023

(65) Prior Publication Data

US 2023/0354722 A1    Nov. 2, 2023

Related U.S. Application Data

(60) Continuation of application No. 17/722,379, filed on Apr. 17, 2022, now Pat. No. 11,744,165, which is a division of application No. 16/785,673, filed on Feb. 10, 2020, now Pat. No. 11,309,490.

(51) Int. Cl.
  *H10N 70/00*  (2023.01)
  *H10B 63/00*  (2023.01)
  *H10N 70/20*  (2023.01)

(52) U.S. Cl.
  CPC ........... *H10N 70/826* (2023.02); *H10B 63/24* (2023.02); *H10N 70/063* (2023.02); *H10N 70/231* (2023.02); *H10N 70/841* (2023.02); *H10N 70/8613* (2023.02); *H10N 70/8828* (2023.02)

(58) Field of Classification Search
  None
  See application file for complete search history.

(56) References Cited

U.S. PATENT DOCUMENTS

| | | | | |
|---|---|---|---|---|
| 10,147,876 B1 * | 12/2018 | Huang | ................. | H10N 70/235 |
| 2015/0028280 A1 * | 1/2015 | Sciarrillo | ............... | H10B 63/20 |
| | | | | 257/4 |
| 2017/0271581 A1 * | 9/2017 | Seong | ................. | H10N 70/826 |
| 2020/0287133 A1 * | 9/2020 | Sarkar | ................. | H10N 70/231 |

* cited by examiner

*Primary Examiner* — Mounir S Amer
(74) *Attorney, Agent, or Firm* — JCIPRNET

(57) ABSTRACT

Memory devices and methods of forming the same are provided. A memory device includes a substrate, a first conductive layer, a phase change layer, a selector layer and a second conductive layer. The first conductive layer is disposed over the substrate. The phase change layer is disposed over the first conductive layer. The selector layer is disposed between the phase change layer and the first conductive layer. The second conductive layer is disposed over the phase change layer. In some embodiments, at least one of the phase change layer and the selector layer has a narrow-middle profile.

20 Claims, 14 Drawing Sheets

MEMORY DEVICES AND METHODS OF FORMING THE SAME

CROSS-REFERENCE TO RELATED APPLICATION

This application is a continuation application of and claims the priority benefit of a prior application Ser. No. 17/722,379, filed on Apr. 17, 2022. The prior application Ser. No. 17/722,379 is a divisional application of and claims the priority benefit of a prior application Ser. No. 16/785,673, filed on Feb. 10, 2020. The entirety of each of the above-mentioned patent applications is hereby incorporated by reference herein and made a part of this specification.

BACKGROUND

Semiconductor memories are used in integrated circuits for electronic applications, including radios, televisions, cell phones, and personal computing devices, as examples. PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells. However, there are still many challenges related to PCRAMs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
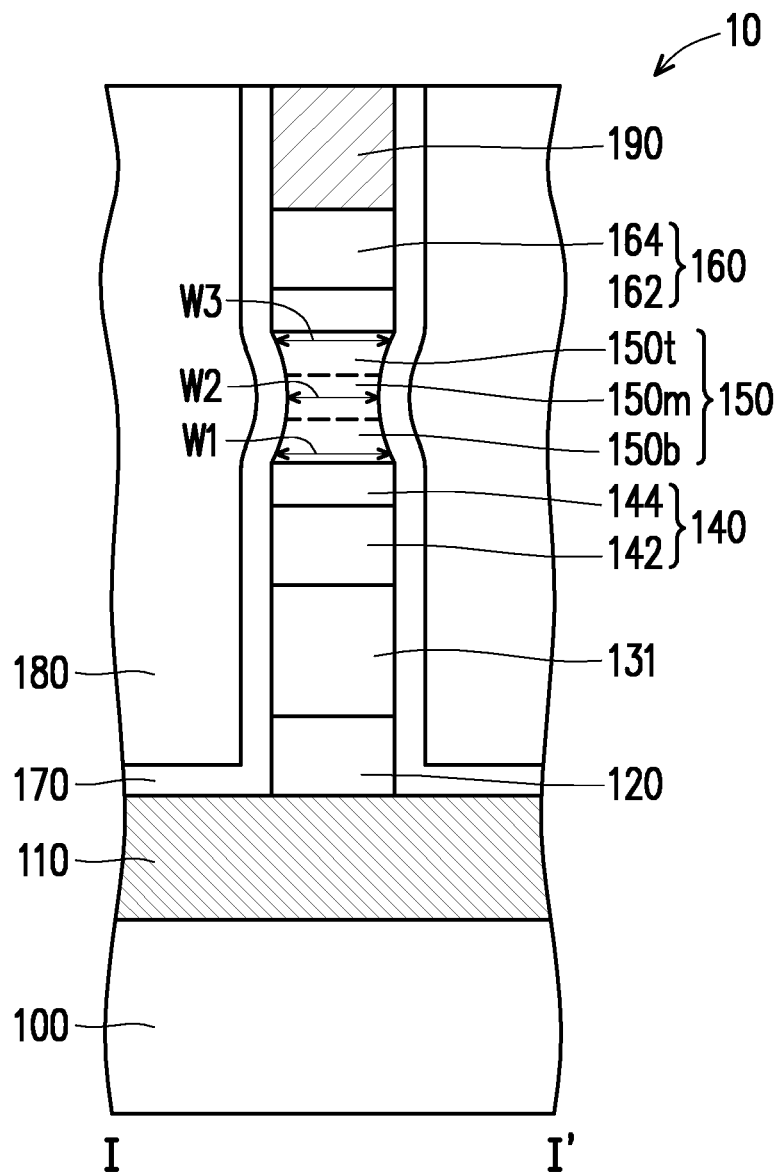
FIG. 1A shows a top view of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a memory device, such a phase-change random access memory (PCRAM) device, and a method of forming the same. The phase change layer between a bottom electrode layer and a top electrode layer is shaped to have a narrow-middle profile that is narrow in the middle portion thereof. By reducing the middle width of the phase change layer, the heating of the phase change layer is centralized and therefore the reset current is reduced.

Figure 1B:
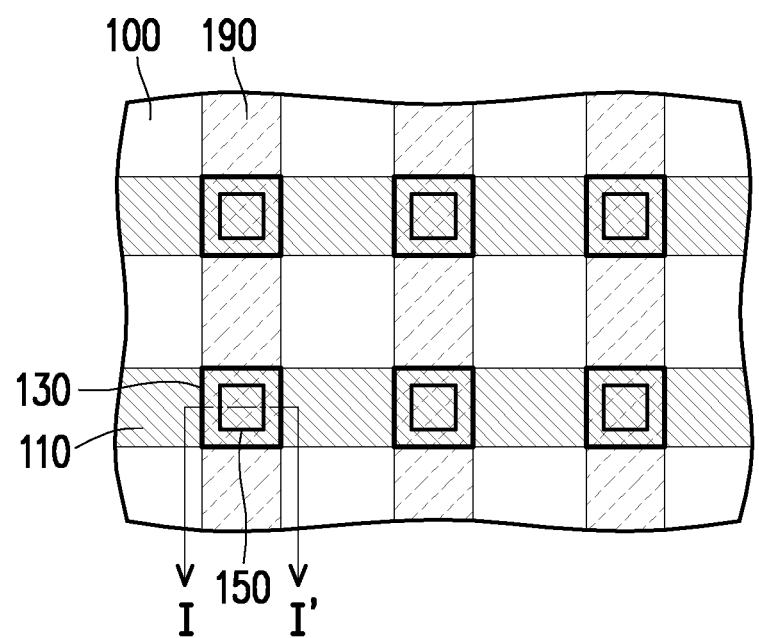
FIG. 1B shows a cross-sectional view of the memory device along a cut line I-I' of FIG. 1A.

FIG. 1A shows a top view of a memory device according to some embodiments of the present disclosure. FIG. 1B shows a cross-sectional view of the memory device along a cut line I-I' of FIG. 1A, in which only few elements are shown for the purpose of simplicity and clarity.

In some embodiments, a memory device 10 includes a substrate 100, a conductive layer 110, a selector layer 130, a phase change layer 150 and a conductive layer 190. The conductive layer 110 is disposed over the substrate 100 and functions as a bottom electrode layer. The conductive layer 190 is disposed over the conductive layer 110 and functions as a top electrode layer. The selector layer 130 and the phase change layer 150 are disposed between the conductive layer 110 and the conductive layer 190. In some embodiments, from a top view as shown in FIG. 1B, the minimum dimension of the phase change layer 150 is less than the overlapped area between the conductive layer 110 and the conductive layer 190.

In some embodiments, the substrate 100 includes a single crystalline semiconductor material such as Si, Ge, SiGe, GaAs, InSb, GaP, GaSb, InAlAs, InGaAs, GaSbP, GaAsSb or InP. In certain embodiments, the substrate 100 is made of crystalline Si. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 100 has a device layer including transistors such as MOSFET planar transistors, FinFETs, and/or Gate All Around (GAA) transistors. Besides, interconnect metal lines are further included to electrically connect to the transistors that control the operations of the memory device. In some embodiments, the conductive layer 110 is a lower interconnect line, and the conductive layer 190 is an upper interconnect line.

The conductive layer 110 and the conductive layer 190 may be intersected with (e.g., perpendicular to) each other. Specifically, in a memory array as shown in FIG. 1B, multiple conductive layers 110 are disposed in parallel and arranged along a first direction (e.g., X-direction), and multiple conductive layers 190 are disposed in parallel and arranged along a second direction (e.g., Y-direction) different from the first direction. The conductive layer 110 and the conductive layer 190 may be formed of the same material or different materials. In some embodiments, each of the conductive layer 110 and the conductive layer 190 includes polysilicon, aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, a metal alloy (e.g., an aluminum copper alloy), a suitable material, or a combination thereof. In certain embodiments, each of the conductive layer 110 and the conductive layer 190 is made by tungsten.

The phase change layer 150 is disposed between the conductive layer 110 and the conductive layer 190. Specifically, one phase change layer 150 is disposed at the cross point of the corresponding conductive layers 120 and 190. The phase change layer 150 receives the heat generated by a heater (e.g., intermediate layer 140, which will be described later), and a region (called "active region") close to the interface between the phase change layer 150 and the heater undergoes a phase transition from crystalline phase to amorphous phase or vice versa, depending on the amount and duration of heat generated when an electric current is applied to the heater. The phase transition between the crystalline phase and the amorphous phase of the phase change layer 150 is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change layer 150 for different needs, the material of the phase change layer 150 may be doped with various elements at different amounts to adjust the proportion of the short range order and the long range order inside the bonding structure of the material. The doped element may be any element used for semiconductor doping through the use of, for example, ion implantation.

In some embodiments, the material of the phase change layer 150 includes one selected from the group consisting of Ge, Ga, Sn and In, and one or more selected from the group consisting of Sb and Te. In some embodiments, the material of the phase change layer 150 further includes one or more of nitrogen, bismuth and silicon oxide. For example, the phase change layer 150 is a binary system including GaSb, InSb, InSe, SbTe, GeTe or GeSb; a ternary system including GeSbTe, InSbTe, GaSeTe, SnSbTe, InSbGe or GaSbTe; or a quaternary system including GeSnSbTe, GeSbSeTe, TeGeSbS, GeSbTeO, or GeSbTeN. In certain embodiments, the phase change layer 150 is a GeSbTe alloy (e.g., $Ge_2Sb_2Te_5$) with or without doped by nitrogen and/or silicon oxide. The phase change layer 150 may include another phase change resistive material, such as metal oxides including tungsten oxide, nickel oxide, copper oxide, etc. The phase change layer 150 may have a single-layer or multi-layer structure. In some embodiments, the phase change layer 150 has a thickness of about 20 nm to about 60 nm.

In some embodiments, the phase change layer 150 has a narrow-middle profile, as shown in FIG. 1A. In some embodiments, the narrow-middle profile indicates a profile that is narrow in a middle portion thereof. For example, the middle portion is the narrowest portion of the narrow-middle profile. It is noted that, in some embodiments, the middle portion is not necessary to be the center portion of the phase change layer 150, but merely the narrowest portion in the middle between the top portion and the bottom portion. In some embodiments, as shown in FIG. 1A, the phase change layer 150 includes a bottom portion 150b, a middle portion 150m and a top portion 150t, and a width W2 of the middle portion 150m is smaller than each of a width W1 the bottom portion 150b and a width W3 of the top portion 150t. In some embodiments, the width W1 of the bottom portion 150b is substantially the same as the width W3 of the top portion 150t of the phase change layer 150. However, the present disclosure is not limited thereto. In other embodiments, the width W1 of the bottom portion 150b may be different from the width W3 of the top portion 150t of the phase change layer 150. In some embodiments, the phase change layer 150 has a smooth and recessed sidewall without a turning point. The phase change layer 150 is described having a vase-shaped profile, an hourglass-shaped profile or a Coca-Cola glass shaped profile or the like in some examples.

The phase change layer 150 with such narrow-middle profile provides a benefit of reduced operating electric current required to be supplied to the heater to heat the phase change layer 150 for writing and resetting, and thus significantly reducing the overall power consumption of the memory device.

The selector layer 130 is disposed between the conductive layer 110 and the phase change layer 150. Specifically, one selector layer 130 is disposed at the cross point of the corresponding conductive layers 110 and 190. In a cross-point array with hundreds or more memory cells, many problems disturbing the proper operation of a memory cell may occur. The problems may be electrical in nature, such as leakage current, parasitic capacitance, etc. The problems may also be thermal in nature, such as a thermal disturbance between memory cells. To solve the above problems, a switching device is used to reduce or avoid leakage current from an operating memory cell or from other memory cells passing along the resistive network. By using a switching device, the heaters of other memory cells would not be accidentally turned on by a leakage current, thereby wiping off the recorded states in the memory cells. A switching device functioning like a diode device or a transistor device is used so that only the intended PCRAM cells are selected for reading/writing while other PCRAM cells are not turned on, and to reduce or prevent leakage current originating from the selected PCRAM cells. To provide accurate reading/writing operations, a selector layer having high on-state conductivity and infinite off-state resistance is desired to be formed adjacent to the phase change layer 150 to reduce the power dissipation in the resistive network of the PCRAM, leakage current and cross-talk disturbance, while making sure only the selected PCRAM cells are undergoing reading/writing operation. In this way, a reliable PCRAM can be formed. The selector layer 130 may function as a diode type (such as PN junction diode, Schottky diode, metal-insulator transition MIT, and ovonic threshold switching OTS) device with a diode junction formed within the selector layer 130. In some embodiments, the selector layer 130 is an ovonic threshold switching (OTS) material, which is an amorphous material.

In some embodiments, the selector layer 130 provides a current-voltage non-linearity to the PCRAM, and this reduces leakage current. In some embodiments, the selector layer 130 includes one or more selected from the group consisting of GeSe doped with one or more selected from the group consisting of N, P, S, Si and Te; AsGeSe doped with one or more selected from the group consisting of N, P, S, Si and Te; and AsGeSeSi doped with one or more selected from the group consisting of N, P, S, Si and Te. In other embodiments, the selector layer 130 is made of a material including SiOx, TiOx, AlOx, WOx, TixNyOz, HfOx, TaOx, NbOx, the like, or a combination thereof, where x, y and z are non-stoichiometric values. In certain embodiments, the selector layer 130 is a chalcogenide or a solid-electrolyte material containing one or more of Ge, Sb, S, and Te. The selector layer 130 may have a single-layer or multi-layer structure. In some embodiments, the thickness of the selector layer 130 is in a range from about 10 nm to about 30 nm.

In some embodiments, as shown in the cross-sectional view in FIG. 1A, an intermediate layer 140 is further included in the memory device 10 and disposed between the selector layer 130 and the phase change layer 150. In some embodiments, the intermediate layer 140 has a substantially straight sidewall profile. In some embodiments, the top width of the intermediate layer 140 is substantially the same as the bottom width of the phase change layer 150. In other embodiments, the top width of the intermediate layer 140 is greater than the bottom width of the phase change layer 150; that is, the top edge of the intermediate layer 140 is exposed by the phase change layer 150. In some embodiments, the intermediate layer 140 includes tungsten (W), graphene, MoS₂, carbon (C), titanium (Ti), tantalum (Ta), tungsten nitride (WN), titanium nitride (TiN), tantalum nitride (TaN), the like or a combination thereof. In some embodiments, the thickness of the intermediate layer 140 is in a range from about 1 to about 25 nm. In some embodiments, the intermediate layer 140 functions as a heater, a heat sink or a thermal insulator for the phase change layer 150. The thermal insulator is beneficial to centralize heat in the phase change layer 150. The intermediate layer 140 is referred to a heater in some example. In some embodiments, the intermediate layer 140 functions as a barrier layer to prevent material diffusion into and contamination of the phase change layer 150. In some embodiments, the intermediate layer 140 functions as a current limiting layer to reduce or avoid leakage current.

The intermediate layer 140 may be provided with multiple functions. For example, the upper portion of the intermediate layer 140 functions as a heater or a thermal insulator (e.g., W, Ti, Ta, WN, TiN or TaN), and the lower portion of the intermediate layer 140 functions as a current limiting layer (e.g., C). The intermediate layer 140 may have a single-layer or multi-layer structure. In certain embodiments, the intermediate layer 140 has a carbon layer 142 adjacent to the selector layer 130 and a tungsten layer 144 adjacent to the phase change layer 150. In some embodiments, the thickness of the carbon layer 142 is in a range from about 0.5 nm to about 20 nm, and the thickness of the tungsten layer 144 is in a range from about 0.5 nm to about 5 nm.

In some embodiments, as shown in the cross-sectional view in FIG. 1A, an intermediate layer 120 is further included in the memory device 10 and disposed between the conductive layer 110 and the selector layer 130. In some embodiments, the intermediate layer 120 has a substantially straight sidewall profile. In some embodiments, the intermediate layer 140 includes tungsten (W), graphene, MoS₂, carbon (C), titanium (Ti), tantalum (Ta), tungsten nitride (WN), titanium nitride (TiN), tantalum nitride (TaN), the like or a combination thereof. In some embodiments, the thickness of the intermediate layer 120 is in a range from about 1 to about 20 nm. In some embodiments, the intermediate layer 120 functions as a barrier layer to prevent material diffusion into and contamination of the selector layer 130. In some embodiments, the intermediate layer 120 functions as a current limiting layer to reduce or avoid leakage current. The intermediate layer 120 may have a single-layer or multi-layer structure. In some embodiments, the intermediate layer 120 has a carbon layer adjacent to the selector layer 130. In some embodiments, the thickness of the carbon layer is in a range from about 1 nm to about 20 nm.

In some embodiments, as shown in the cross-sectional view in FIG. 1A, an intermediate layer 160 is further included in the memory device 10 and disposed between the phase change layer 150 and the conductive layer 190. In some embodiments, the intermediate layer 160 has a substantially straight sidewall profile. In some embodiments, the bottom width of the intermediate layer 160 is substantially the same as the top width of the phase change layer 150. In other embodiments, the bottom width of the intermediate layer 160 is greater than the top width of the phase change layer 150; that is, the bottom edge of the intermediate layer 160 is exposed by the phase change layer 150. In some embodiments, the intermediate layer 160 includes tungsten (W), graphene, MoS₂, carbon (C), titanium (Ti), tantalum (Ta), tungsten nitride (WN), titanium nitride (TiN), tantalum nitride (TaN), the like or a combination thereof. In some embodiments, the thickness of the intermediate layer 160 is in a range from about 1 to about 25 nm. In some embodiments, the intermediate layer 160 functions as a barrier layer to prevent material diffusion into and contamination of the phase change layer 150. In some embodiments, the intermediate layer 160 functions as a thermal insulator to centralize heat in the phase change layer 150. In some embodiments, the intermediate layer 160 functions as a current limiting layer to reduce or avoid leakage current. The intermediate layer 160 may have a single-layer or multi-layer structure. In some embodiments, the intermediate layer 160 has a tungsten layer 162 adjacent to the phase change layer 150 and a carbon layer 164 adjacent to the conductive layer 190. In some embodiments, the thickness of the tungsten layer 162 is in a range from about 0.5 nm to about 5 nm, and the thickness of the carbon layer 164 is in a range from about 0.5 nm to about 20 nm.

In some embodiments, as shown in the cross-sectional view in FIG. 1A, a liner layer 170 and a dielectric layer 180 are further included in the memory device 10. The liner layer 170 is disposed on the sidewalls of the selector layer 130 and the phase change layer 150. In some embodiments, the liner layer 170 extends conformally along the sidewalls of the conductive layer 190, the intermediate layer 160, the phase change layer 150, the intermediate layer 140, the selector layer 130 and the intermediate layer 120, downwardly to the conductive layer 110, and continues to extend along the top surface of the conductive layer 110. The dielectric layer 180 is disposed aside the liner layer 170 and over the conductive layer 110. Specifically, the liner layer 170 is disposed between the dielectric layer 180 and each of the selector layer 130, the phase change layer 150, the conductive layer 190 and the optional intermediate layers adjacent to the selector layer 130 or the phase change layer 150.

In some embodiments, each of the liner layer 170 and the dielectric layer 180 includes, for example but not limited to, silicon oxide (SiO₂), silicon nitride (Si₃N₄), silicon oxynitride (SiON), SiOCN, SiCN, Al₂O₃, fluorine-doped silicate glass (FSG), a low-k material having a dielectric constant less than 3.5 (e.g., SiOC), or a suitable dielectric material used in manufacturing semiconductor devices. The liner layer 170 is an electrical and thermal insulator, and has a thickness in a range from about 5 nm to about 50 nm in some embodiments. In some embodiments, the liner layer 170 includes silicon nitride, and the dielectric layer 180 includes silicon oxide.

FIG. 2A to FIG. 2I show a method of forming a memory device according to the some embodiments of the present disclosure. It is understood that additional operations can be provided before, during, and after processes shown by FIG. 2A to FIG. 2I and some of the operations described below can be replaced or eliminated, for additional embodiments of the methods. The order of the operations/processes may be interchangeable.

Figure 2A:
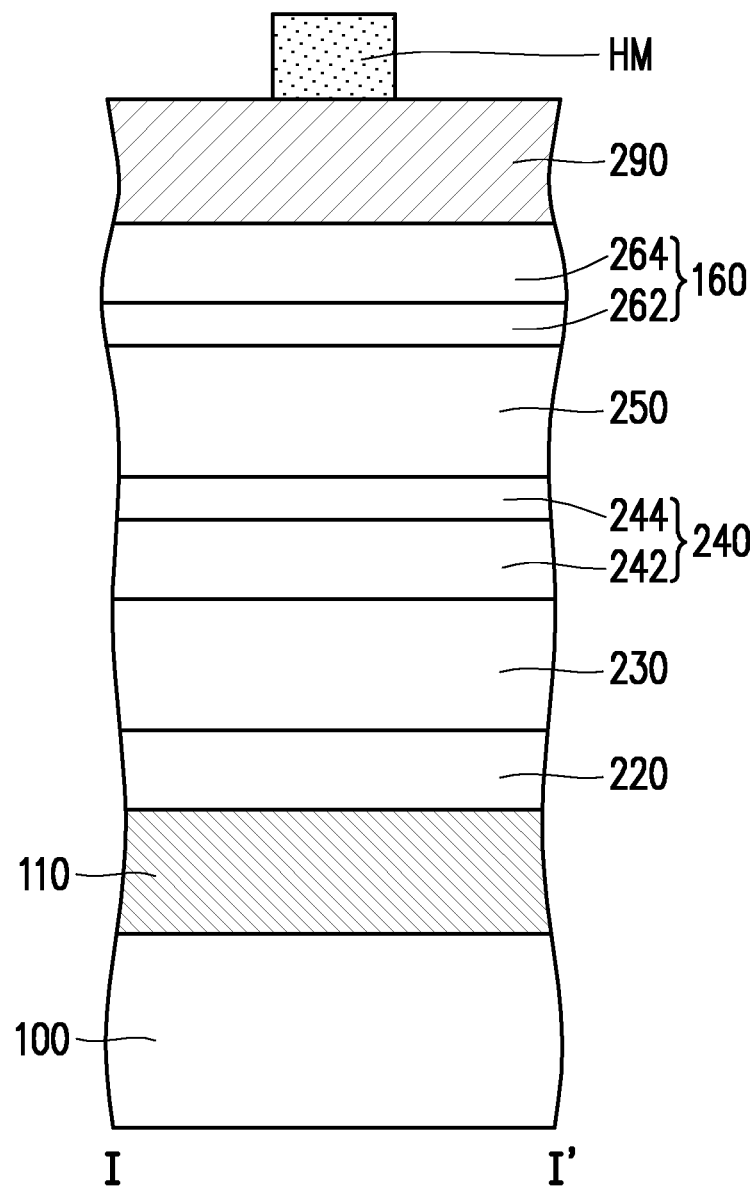
FIG. 2A to FIG. 2I show a method of forming a memory device according to some embodiments of the present disclosure.

FIG. 2A shows an operation of forming a conductive layer 110, an intermediate layer 220, a selector layer 230, an intermediate layer 240, a phase change layer 250, an intermediate layer 260 and a mask layer HM sequentially on a substrate 100.

The substrate 100 may be any substrate that can be used for a memory device. The material of the substrate 100 may be similar to that of the substrate 100 described in FIG. 1A. In certain embodiments, the substrate 100 is made of crystalline silicon.

The conductive layer 110 may be any bottom electrode material that can be used for a memory device. The material of the conductive layer 110 may be similar to that of the conductive layer 110 described in FIG. 1A. In certain embodiments, the conductive layer 110 is made by tungsten.

The material of the intermediate layer 220 may be similar to that of the intermediate layer 120 described in FIG. 1A. In certain embodiments, the intermediate layer 220 is a carbon layer. In some embodiments, the intermediate layer 220 is formed by a suitable deposition method such as chemical vapor deposition (CVD), physical vapor deposition (PVD), atomic layer deposition (ALD) or any other thin film deposition method.

The material of the selector layer 230 may be similar to that of the selector layer 130 described in FIG. 1A. In certain embodiments, the selector layer 230 is a chalcogenide or a solid-electrolyte material containing one or more of Ge, Sb, S, and Te.

The material of the intermediate layer 240 may be similar to that of the intermediate layer 140 described in FIG. 1A. In certain embodiments, the intermediate layer 240 includes a carbon layer 242 and a tungsten layer 244 over the carbon layer 242.

The phase change layer 250 may be similar to that of the phase change layer 150 described in FIG. 1A. In certain embodiments, the phase change layer 250 is a GeSbTe alloy (e.g., $Ge_2Sb_2Te_5$) with or without doped by nitrogen and/or silicon oxide.

The material of the intermediate layer 260 may be similar to that of the intermediate layer 160 described in FIG. 1A. In certain embodiments, the intermediate layer 260 includes a tungsten layer 262 and a carbon layer 264 over the tungsten layer 262.

In some embodiments, the conductive layer 110, the intermediate layer 220, the selector layer 230, the intermediate layer 240, the phase change layer 250 and the intermediate layer 260 constitute a film stack that extends in a first direction (e.g., X-direction). In some embodiments, each layer of the film stack is formed by a suitable deposition process such as chemical vapor deposition (CVD), physical vapor deposition (PVD), atomic layer deposition (ALD) or any other thin film deposition method. Thereafter, the film stack is patterned by photolithography and etching processes.

The conductive layer 290 may be any top electrode material that can be used for a memory device. The material of the conductive layer 290 may be similar to that of the conductive layer 190 described in FIG. 1A. In certain embodiments, the conductive layer 190 is made by tungsten.

In some embodiments, the conductive layer 290 is blanket-formed over the underlying film stack by a suitable deposition method such as chemical vapor deposition (CVD), physical vapor deposition (PVD), atomic layer deposition (ALD) or any other thin film deposition method.

The mask layer HM may be any hard mask material that can be used for patterning the underlying film stack. In some embodiments, the mask layer HM includes silicon oxide, silicon nitride, silicon carbide, amorphous carbon, a photoresist material, TiN, a suitable hard mask material, or a combination thereof. The mask layer HM may have a single-layer or multi-layer structure. In some embodiments, the mask layer extends in a second direction (e.g., Y-direction) different from the first direction. In some embodiments, the mask layer HM is formed by a spin coating or a suitable deposition method such as chemical vapor deposition (CVD), physical vapor deposition (PVD), atomic layer deposition (ALD) or any other thin film deposition method, and followed by photolithography and etching processes.

Figure 2B:
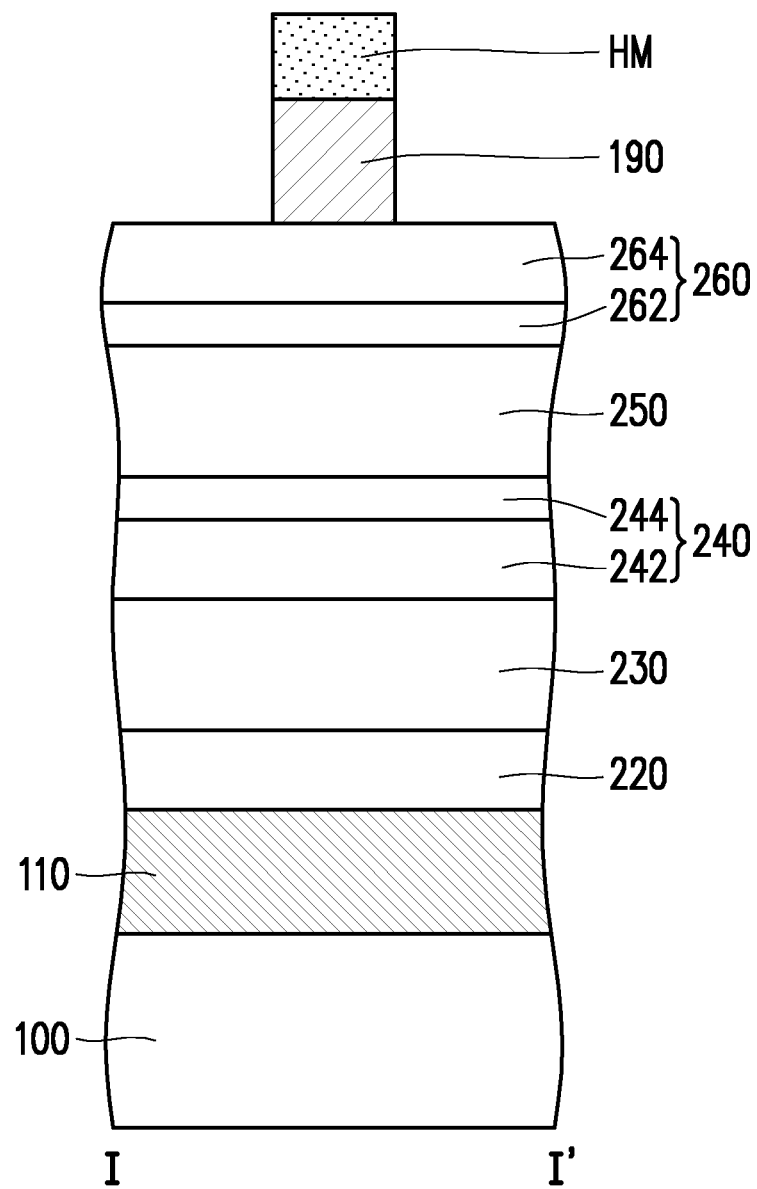

FIG. 2B shows an operation of patterning the conductive layer 290 by using the mask layer HM as a mask. In some embodiments, the remaining conductive layer is labelled as a conductive layer 190 that has a strip shape and extends in the second direction. In some embodiments, the patterning operation in FIG. 2B includes a dry etching process, in which the etching gas includes a halogen-containing species such as $Cl_2$. The etching gas may include an oxygen-containing gas (e.g., $O_2$) and/or an inert gas (e.g., Ar) as needed. In some embodiments, the conductive layer 190 has a substantially straight sidewall.

Figure 2C:
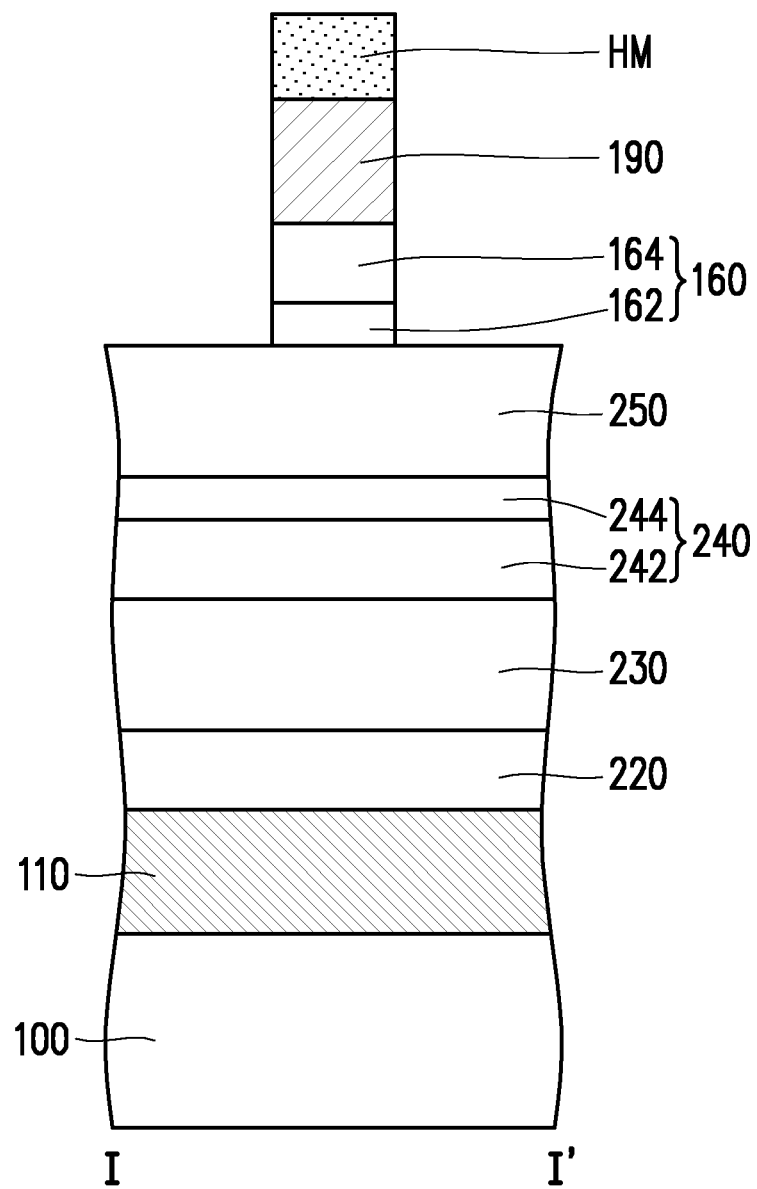

FIG. 2C shows an operation of patterning the intermediate layer 260 by using the mask layer HM as a mask. In some embodiments, the remaining intermediate layer 260 is labelled as an intermediate layer 160 that has an island shape. In some embodiments, the patterning operation in FIG. 2C includes a dry etching process, in which the etching gas includes a halogen-containing gas such as $Cl_2$. The etching gas may include an oxygen-containing gas (e.g., $O_2$) and/or an inert gas (e.g., Ar) as needed. In some embodiments, the intermediate layer 160 has a substantially straight sidewall.

Figure 2D:
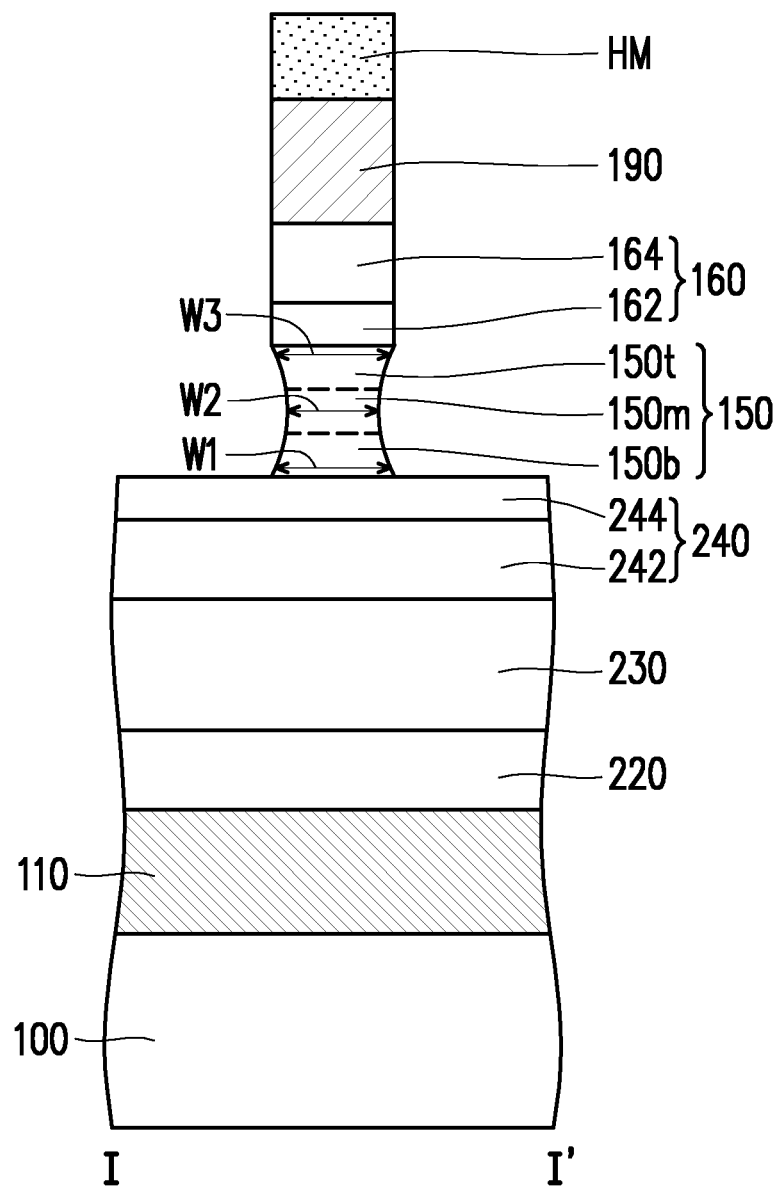

FIG. 2D shows an operation of patterning the phase change layer 250 by using the mask layer HM as a mask. In some embodiments, the remaining phase change layer 250 is labelled as a phase change layer 150 that has an island shape. In some embodiments, the patterning operation in FIG. 2D includes a chemical etching process. Herein, in a chemical etching process, an etching gas interacts with the material surface so as to shape or trim the profile of the target layer. In the chemical etching process, the target layer is etched vertically and laterally. In certain embodiments, the phase change layer 150 has a recessed sidewall upon the chemical etching process. Specifically, the phase change layer 150 has a narrow-middle profile with a smooth and concave sidewall. In some embodiments, in the chemical etching process of FIG. 2D, the etching gas includes a halogen-containing gas such as HBr, $CF_4$, $C_2F_2$ or a combination thereof. The etching gas may include an oxygen-containing gas (e.g., $O_2$) and/or an inert gas (e.g., Ar) as needed.

Figure 2E:
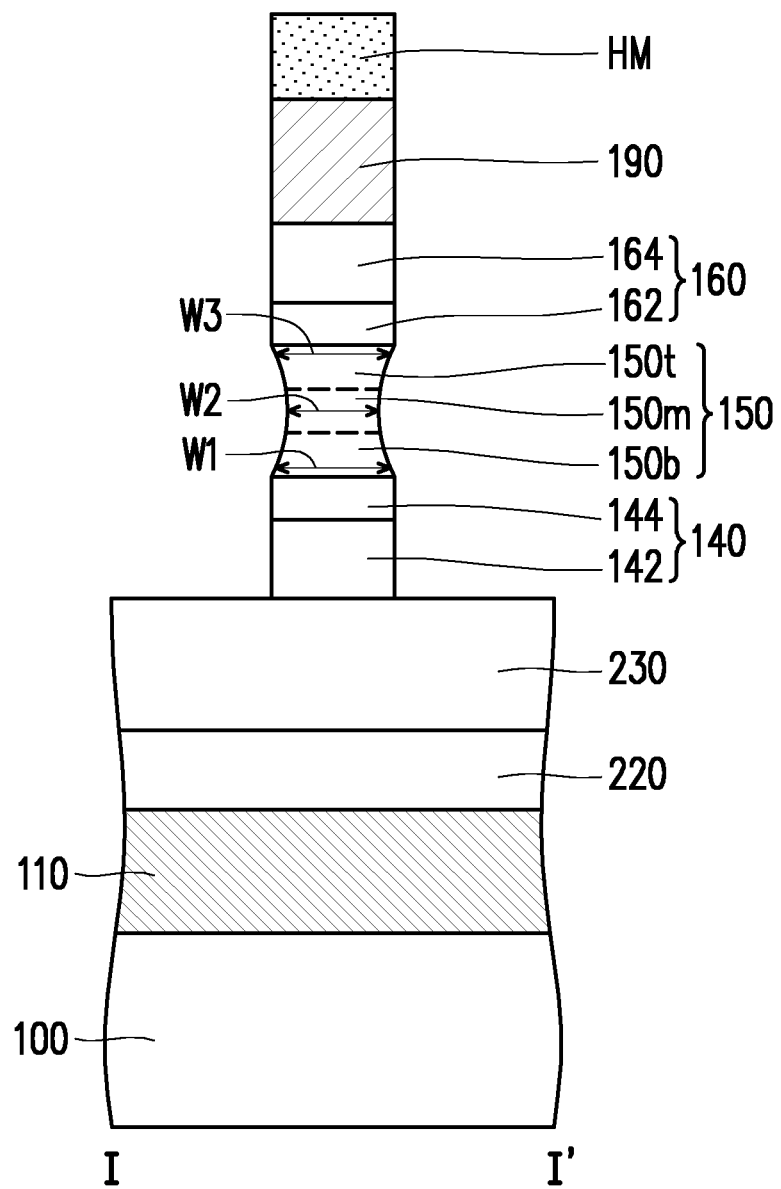

FIG. 2E shows an operation of patterning the intermediate layer 240 by using the mask layer HM as a mask. In some embodiments, the remaining intermediate layer 240 is labelled as an intermediate layer 140 that has an island shape. In some embodiments, the patterning operation in FIG. 2E includes a dry etching process, in which the etching gas includes a halogen-containing gas such as $Cl_2$. The etching gas may include an oxygen-containing gas (e.g., $O_2$)

and/or an inert gas (e.g., Ar) as needed. In some embodiments, the intermediate layer 160 has a substantially straight sidewall.

Figure 2F:
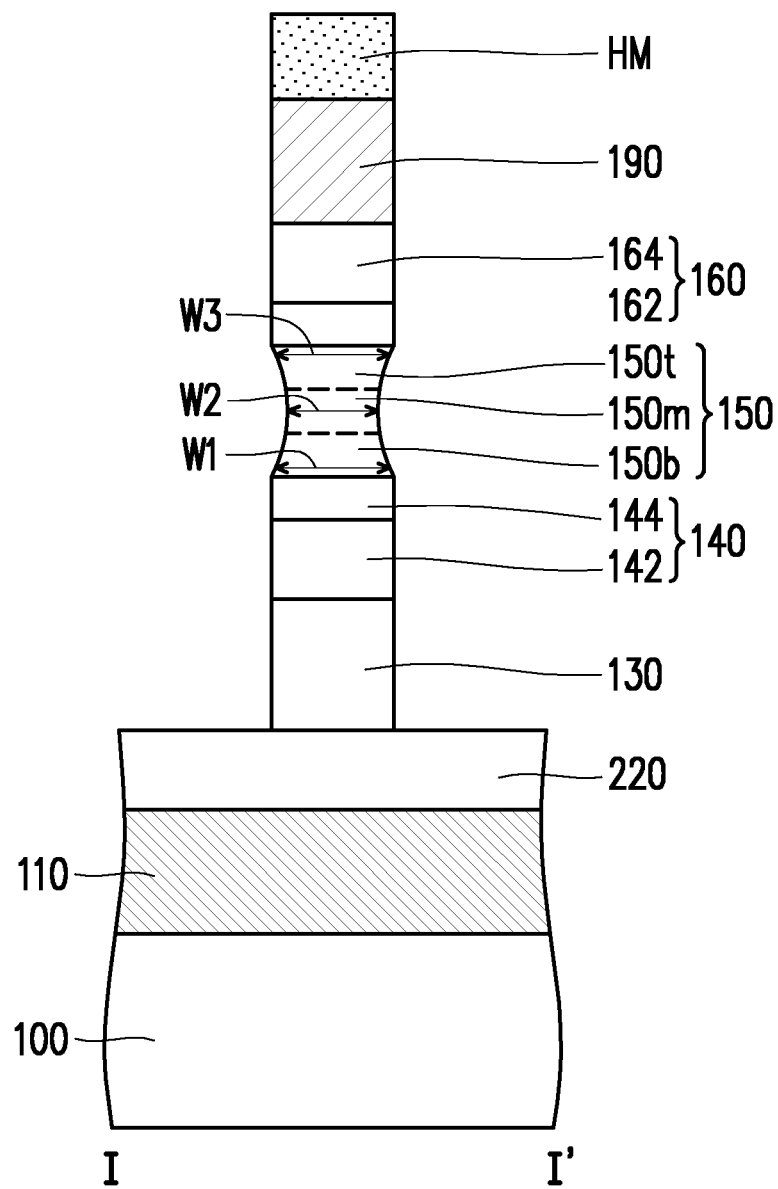

FIG. 2F shows an operation of patterning the selector layer 230 by using the mask layer as a mask. In some embodiments, the remaining selector layer 230 is labelled as a selector layer 130 that has an island shape. In some embodiments, the patterning operation in FIG. 2F includes a physical etching process. Herein, in a physical etching process, an etching gas bombards the material surface without chemical reaction, so the shape of the target layer is substantially the same as the shape of the etching mask. In the physical etching process, the target layer is etched vertically. In certain embodiments, the selector layer 130 has a substantially straight sidewall upon the physical etching process. In some embodiments, in the physical etching process of FIG. 2F, the etching gas includes an inert gas (e.g., Ar). The etching gas may include an oxygen-containing gas (e.g., 02) as needed. In some embodiments, the etching gas in FIG. 2F is chlorine-free etching gas.

Figure 2G:
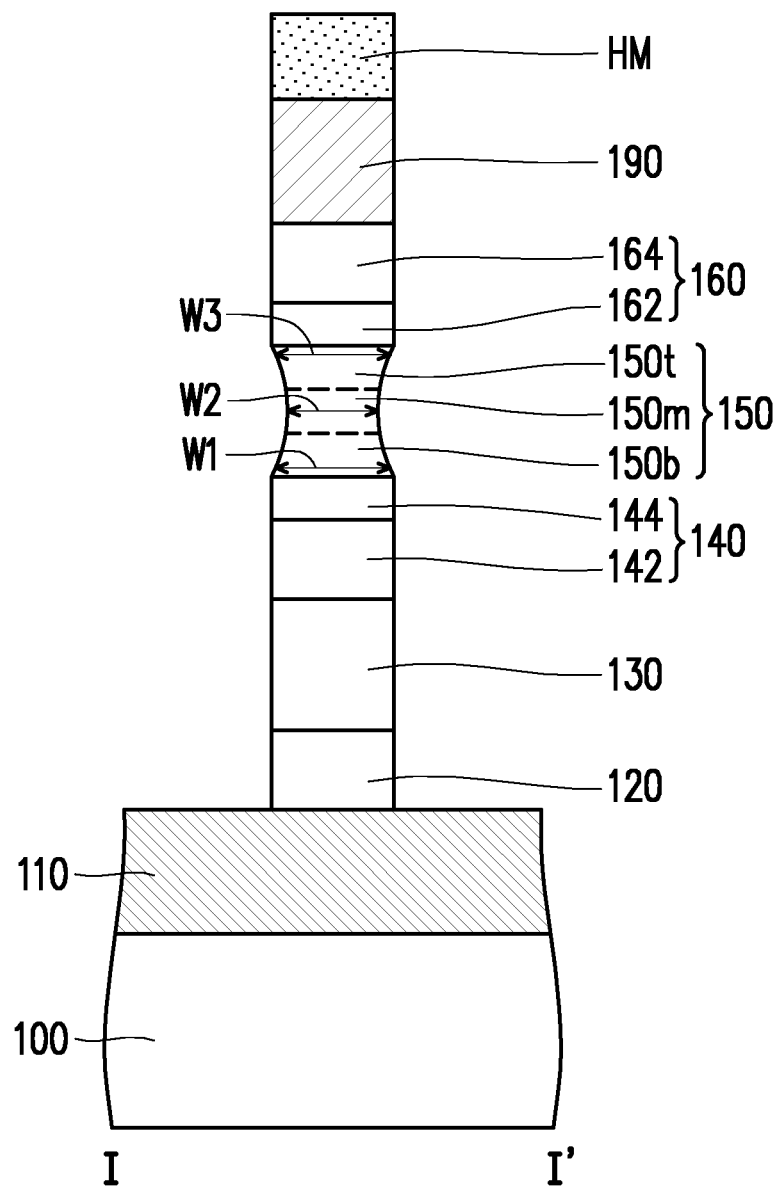

FIG. 2G shows an operation of patterning the intermediate layer 220 by using the mask layer HM as a mask. In some embodiments, the remaining intermediate layer 220 is labelled as an intermediate layer 120 that has an island shape. In some embodiments, the patterning operation in FIG. 2G includes a dry etching process, in which the etching gas includes a halogen-containing gas such as $Cl_2$. The etching gas may include an oxygen-containing gas (e.g., $O_2$) and/or an inert gas (e.g., Ar) as needed. In some embodiments, the intermediate layer 120 has a substantially straight sidewall.

Figure 2H:
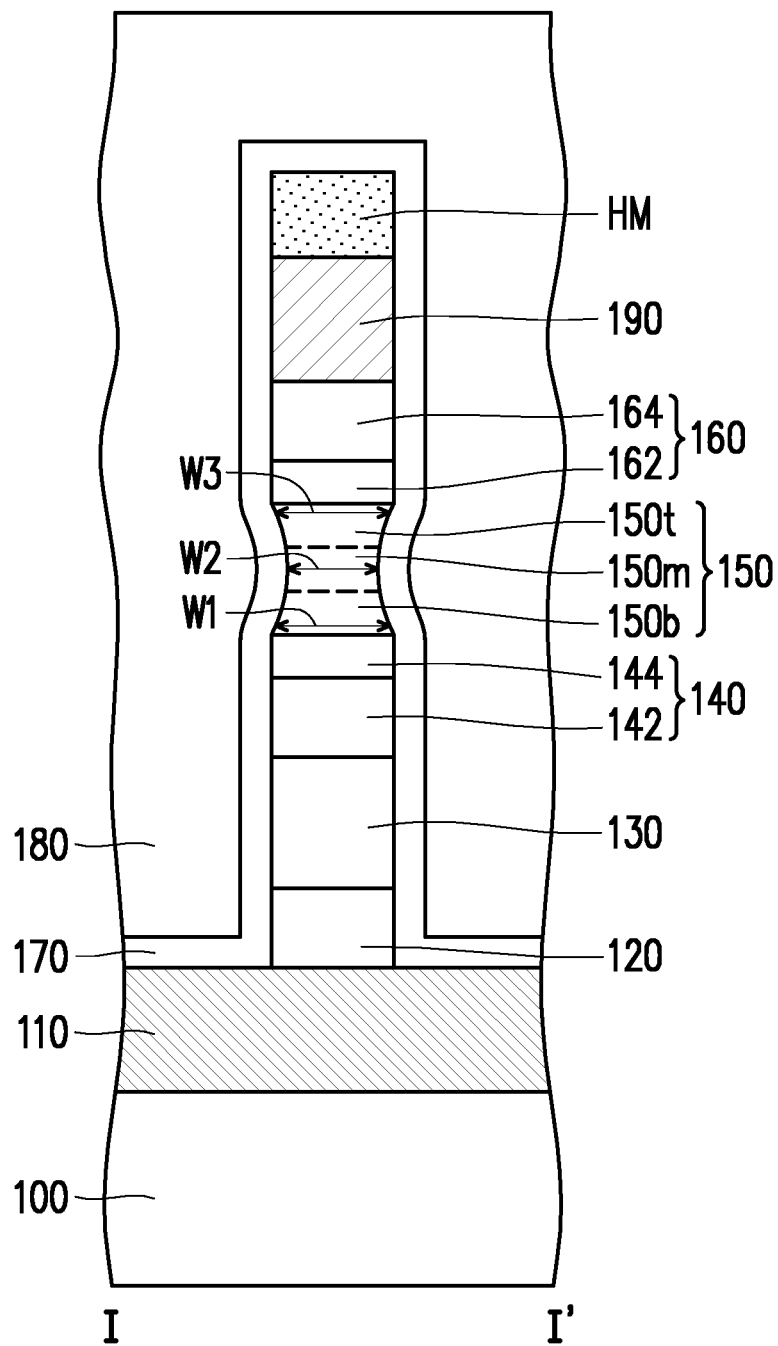

FIG. 2H shows an operation of forming a liner layer 270 and a dielectric layer 280 over the substrate 100 covering the film stack. The materials of the liner layer 270 and the dielectric layer 280 may be similar to those of the liner layer 270 and the dielectric layer 280 described in FIG. 1A. In certain embodiments, the liner layer 270 is a silicon nitride layer, and the dielectric layer 280 is a silicon oxide layer. In some embodiments, the method of forming each of the liner layer 270 and the dielectric layer includes performing a suitable deposition method such as chemical vapor deposition (CVD), physical vapor deposition (PVD), atomic layer deposition (ALD) or any other thin film deposition method.

Figure 2I:
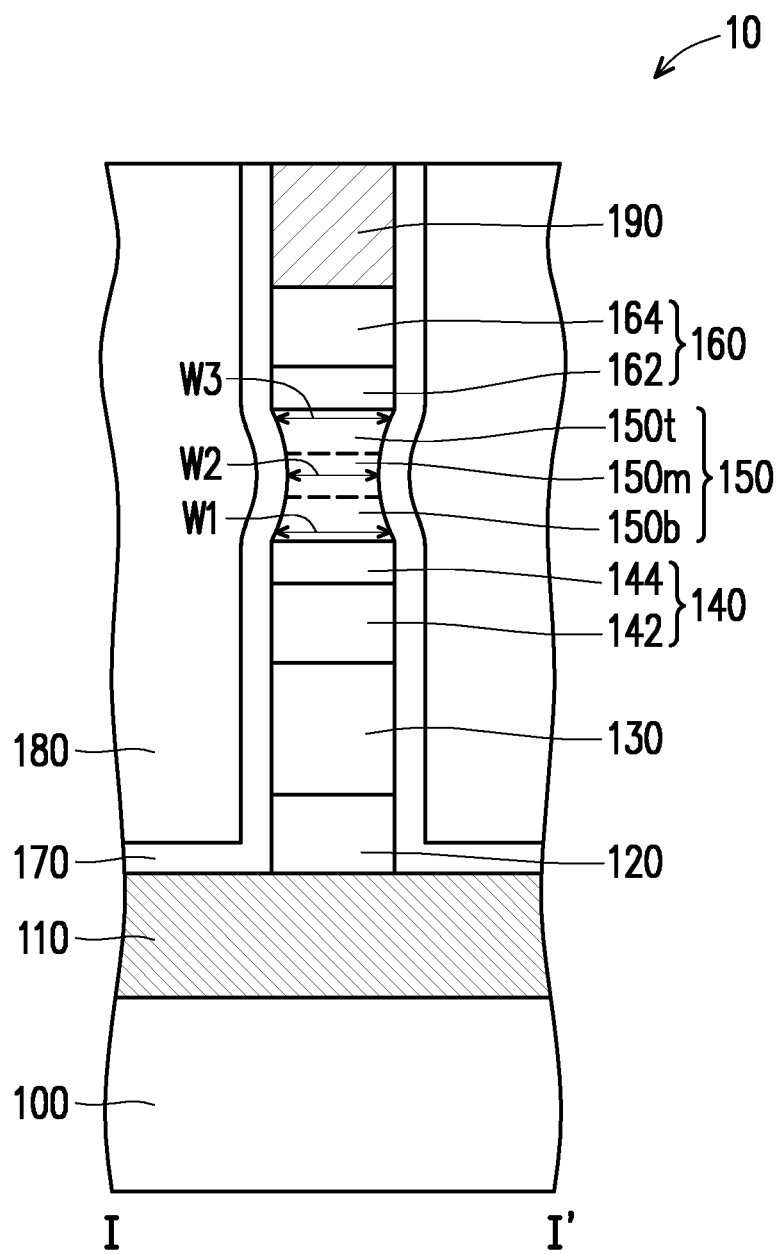

FIG. 2I shows an operation of planarizing the liner layer 270 and the dielectric layer 280. In some embodiments, the remaining liner layer 270 and the dielectric layer 280 are labelled as a liner layer 170 and a dielectric layer 180. In some embodiments, a chemical mechanical polishing (CMP) process is performed until the top surface of the conductive layer 190 is exposed. In some embodiments, the mask layer HM is simultaneously removed during the planarizing operation of FIG. 2I. A memory device 10 of the disclosure is thus completed.

In the memory device 10, the phase change layer 150 between a bottom electrode (e.g., conductive layer 110) layer and a top electrode (e.g., conductive layer 190) is shaped to have a narrow-middle profile that is narrow in the middle portion thereof. By reducing the middle width of the phase change layer, the heating of the phase change layer is centralized and therefore the reset current is reduced.

Figure 3:
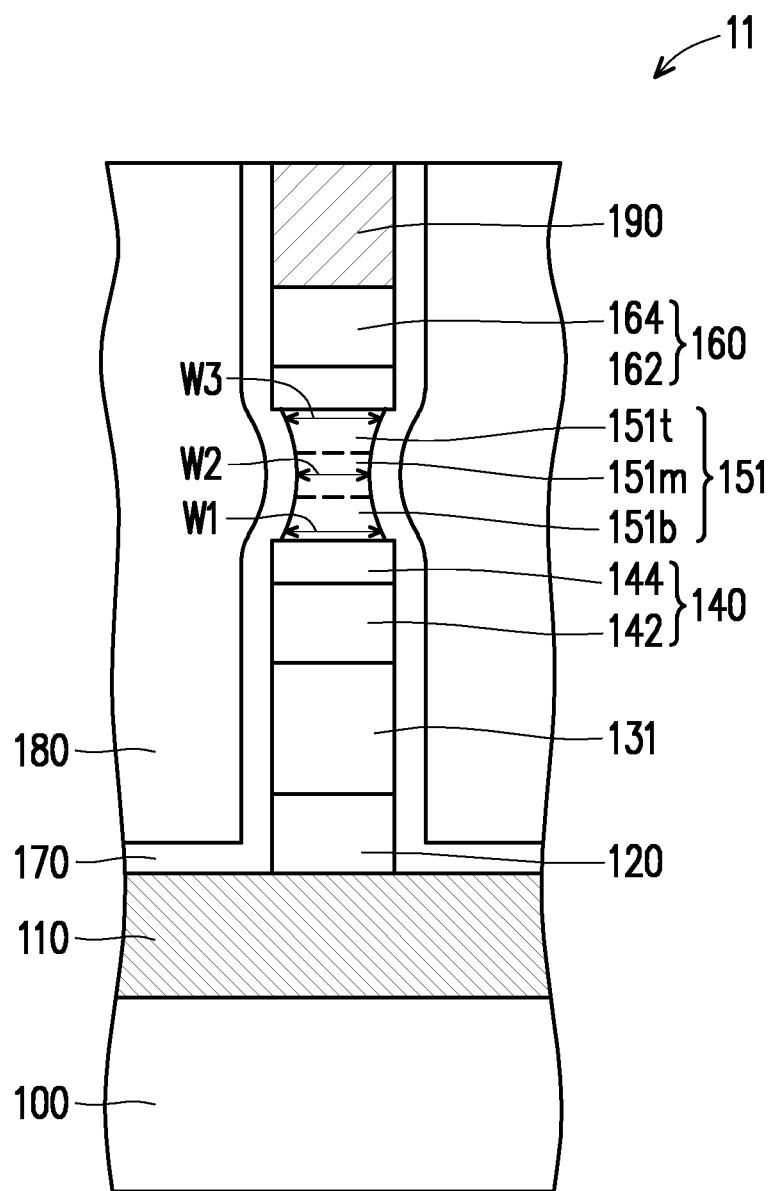
FIG. 3 to FIG. 5 show cross-sectional views of various memory devices in accordance with some embodiments of the present disclosure.
Figure 4:
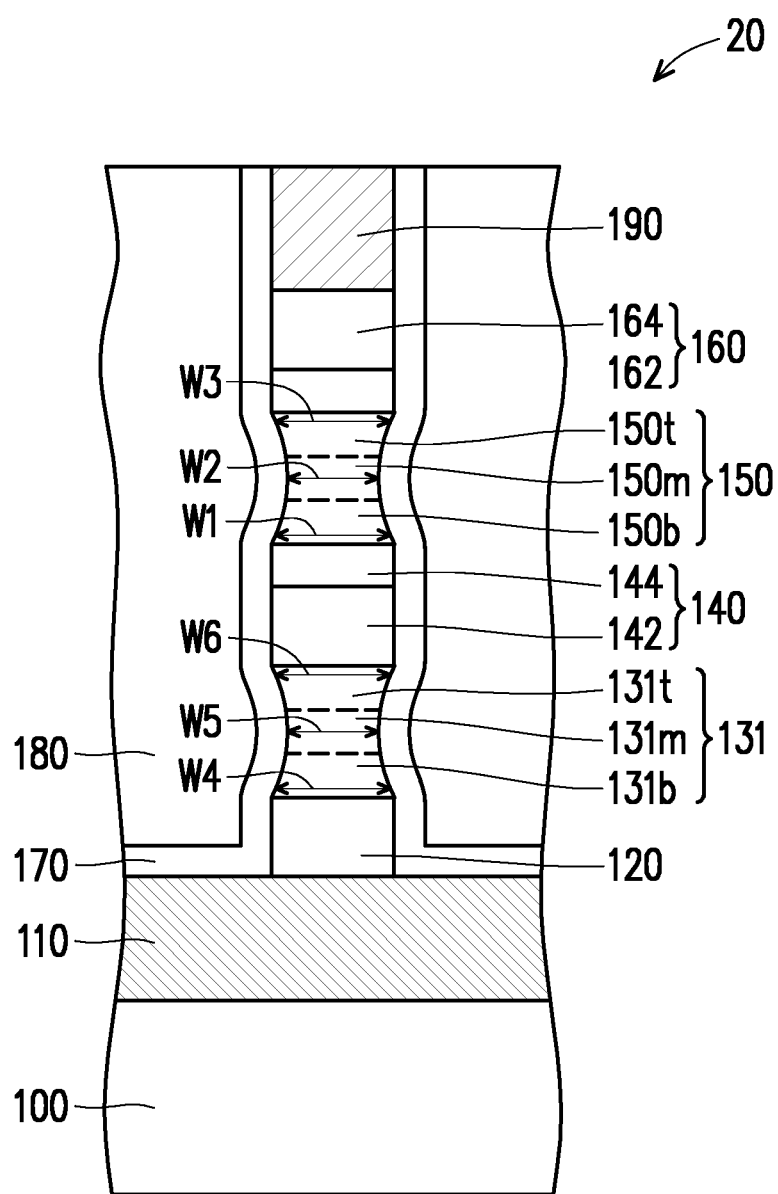
Figure 5:
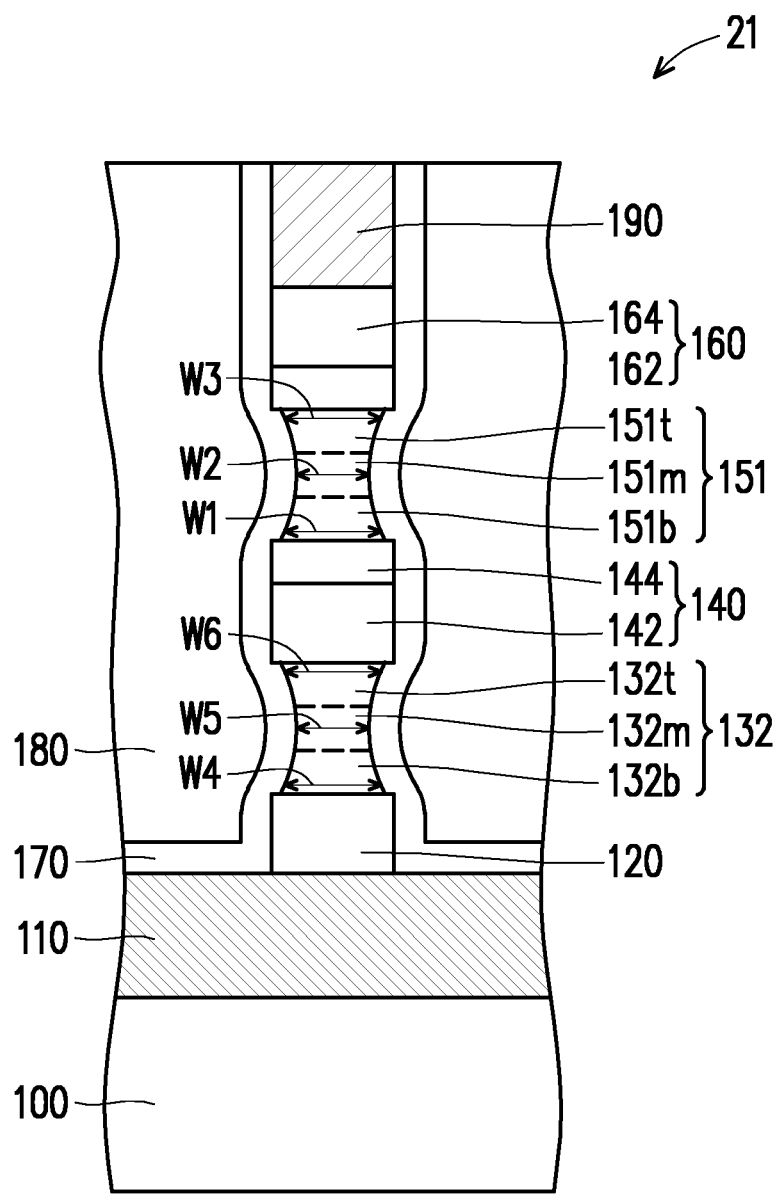

The memory device 10 may be modified to have other configurations, as shown in FIG. 3 to FIG. 5. Each of the memory devices 11, 20 and 21 of FIG. 3 to FIG. 5 may be similar to the memory device of FIG. 2I, with similar features of the memory devices being labeled with similar numerical references and descriptions of the similar features are not repeated herein.

The memory device 11 of FIG. 3 may be similar to the memory device 10 of FIG. 2I, and the difference between them lies in the recessed distance of the phase change layer with respect to the edge of the adjacent intermediate layer. In the memory device 10 of FIG. 2I, the bottom width W1 of the phase change layer 150 is substantially equal to the top width of the intermediate layer 140, and the top width W3 of the phase change layer 150 is substantially equal to the bottom width of the intermediate layer 160. That is, the recessed distance of the phase change layer 150 with respect to the edge of the adjacent intermediate layer 140/160 is about zero. However, the disclosure is not limited thereto. In the memory device 11 of FIG. 3, the bottom width W3 of the phase change layer 151 is less than the top width of the intermediate layer 140, and the top width W3 of the phase change layer 151 is less than the bottom width of the intermediate layer 160. That is, the recessed distance of the phase change layer 151 with respect to the edge of the adjacent intermediate layer 140/160 is greater than zero (e.g., about 1 nm to 5 nm). The recessed distance of the phase change layer may be changed as needed by adjusting the etching parameters of the patterning operation in FIG. 2D.

The memory device 20 of FIG. 4 may be similar to the memory device 10 of FIG. 2I, and the difference between them lies in the shape of the select layer. In some embodiments, the select layer 130 of the memory device 10 has a substantially vertical sidewall, while the select layer 131 of the memory device 20 has a curved sidewall that is concave with respect to the interior of the select layer 131. The smaller middle dimension of the select layer 131 is beneficial for leakage reduction. In the illustrated embodiment, the select layer 131 of the memory device 20 has a narrow-middle profile that is narrow in a middle portion thereof. Specifically, the middle portion is narrower than the top portion or the bottom portion. For example, the middle portion of the select layer 131 is the narrowest portion of the narrow-middle profile. In some embodiments, as shown in FIG. 4, the select layer 131 includes a bottom portion 131b, a middle portion 131m and a top portion 131t, and a width W5 of the middle portion 131m is smaller than each of a width W4 the bottom portion 131b and a width W5 of the top portion 131t. In some embodiments, the width W3 of the bottom portion 131b is substantially the same as or different from the width W3 of the top portion 131t of the select layer 131. In some embodiments, the select layer 131 may be described as having a vase-shaped profile, an hourglass-shaped profile, a Coca-Cola glass shaped profile or the like.

In some embodiments, the memory device 20 may be formed using process operations described above with reference to FIG. 2A to FIG. 2I, but adjusting the parameters of the patterning operation in FIG. 2F. In the illustrated embodiment, the patterning operation in FIG. 2F includes a chemical etching process. Herein, in a chemical etching process, an etching gas interacts with the material surface so as to shape or trim the profile of the target layer. In the chemical etching process, the target layer is etched vertically and laterally. In certain embodiments, the select layer 131 has a recessed sidewall upon the chemical etching process. Specifically, the select layer 131 has a narrow-middle profile with a smooth and concave sidewall. In some embodiments, in the chemical etching process of FIG. 2F, the etching gas includes a halogen-containing gas such as HBr, $CF_4$, $C_2F_2$ or a combination thereof. The etching gas may include an oxygen-containing gas (e.g., $O_2$) and/or an inert gas (e.g., Ar) as needed.

The memory device 21 of FIG. 5 may be similar to the memory device 20 of FIG. 4, and the difference between them lies in the recessed distance of the phase change layer or the select layer with respect to the edge of the adjacent intermediate layer. In the memory device 20 of FIG. 4, the recessed distance of the phase change layer 150 with respect to the edge of the adjacent intermediate layer 140/160 is about zero, and the recessed distance of the select layer 131 with respect to the edge of the adjacent intermediate layer 120/140 is about zero. However, the disclosure is not limited thereto. In the memory device 21 of FIG. 5, the recessed distance of the phase change layer 151 with respect to the edge of the adjacent intermediate layer 140/160 is greater than zero, and the recessed distance of the select layer 132 with respect to the edge of the adjacent intermediate layer 120/140 is greater than zero (e.g., about 1 nm to 5 nm).

The memory devices of the present disclosure are described below with reference to FIG. 2I and FIG. 3 to FIG. 5.

The present disclosure discloses a memory device 10/11/20/21 that includes a substrate 100, a conductive layer 110, a phase change layer 150/151, a selector layer 130/131/132 and a conductive layer 190. The conductive layer 110 is disposed over the substrate 100. The phase change layer 150/151 is disposed over the conductive layer 110. The selector layer 130/131/132 is disposed between the phase change layer 150/151 and the conductive layer 110. The conductive layer 190 is disposed over the phase change layer 150/151.

In some embodiments, the projection area of the conductive layer 190 vertically projected on the substrate 100 is substantially equal to the projection area of the phase change layer 150 vertically projected on the substrate 100. In other embodiments, the projection area of the conductive layer 190 vertically projected on the substrate 100 is slightly greater than the projection area of the phase change layer 151 vertically projected on the substrate 100.

In some embodiments, at least one of the phase change layer and the selector layer has a narrow-middle profile. In some embodiments, only one of the phase change layer and the selector layer has the narrow-middle profile. For example, as shown in FIG. 2I and FIG. 3, only the phase change layer 150/151 has the narrow-middle profile. In other embodiments, as shown in FIG. 4 and FIG. 5, each of the phase change layer 150/151 and the selector layer has the narrow-middle profile.

In some embodiments, the memory device 10/11/20/21 further includes an intermediate layer 120 between the selector layer 130/131/132 and the conductive layer 110, an intermediate layer 140 between the phase change layer 150/151 and the selector layer 130/131/132, and an intermediate layer 160 between the phase change layer 150/151 and the conductive layer 190. In some embodiments, each of the intermediate layers 120, 140 and 160 includes tungsten (W), graphene, $MoS_2$, carbon (C), titanium (Ti), tantalum (Ta), tungsten nitride (WN), titanium nitride (TiN), tantalum nitride (TaN) or a combination thereof.

The present disclosure further discloses a memory device 10/11/20/21 that includes a substrate 100, a conductive layer 110, a conductive layer 190, a phase change layer 150/151, a selector layer 130/131/132 and an intermediate layer 140. The conductive layer 110 is disposed over the substrate 100. The conductive layer 190 is disposed over the conductive layer 110. The phase change layer 150/151 and a selector layer 130/131/132 are disposed between the conductive layer 110 and the conductive layer 190. The intermediate layer 140 serves as a heater and is disposed between the phase change layer 150/151 and the selector layer 130/131/132, wherein the smallest width of the intermediate layer 140 is wider than the smallest width of the phase change layer 150/151 or the smallest width of the selector layer 130/131/132.

In some embodiments, the phase change layer 150/151 includes a bottom portion 150b/151b, a middle portion 150m/151m and a top portion 150t/151t, and a width W2 of the middle portion 150m/151m is smaller than each of a width W1 of the bottom portion 150b/151b and a width W3 of the top portion 150b/151b.

In some embodiments, the bottom width of the phase change layer 150 is substantially equal to the top width of the intermediate layer 140. In other embodiments, the bottom width of the phase change layer 151 is less than the top width of the intermediate layer 140.

In some embodiments, the selector layer 131/132 includes a bottom portion 131b/132b, a middle portion 131m/132m and a top portion 131t/132t, and a width W5 of the middle portion 131m/132m is smaller than each of a width W4 of the bottom portion 131b/132b and a width W6 of the top portion 131t/132t.

In some embodiments, the bottom width of the select layer 131 is substantially equal to the top width of the intermediate layer 120. In other embodiments, the bottom width of the phase change layer 132 is less than the top width of the intermediate layer 120.

In accordance with some embodiments of the present disclosure, a memory device includes a substrate, a first conductive layer, a phase change layer, a selector layer and a second conductive layer. The first conductive layer is disposed over the substrate. The phase change layer is disposed over the first conductive layer. The selector layer is disposed between the phase change layer and the first conductive layer. The second conductive layer is disposed over the phase change layer. In some embodiments, at least one of the phase change layer and the selector layer has a narrow-middle profile.

In accordance with other embodiments of the present disclosure, a memory device includes a substrate, a first conductive layer, a second conductive layer, a phase change layer, a selector layer and an intermediate layer. The first conductive layer is disposed over the substrate. The second conductive layer is disposed over the first conductive layer. The phase change layer and a selector layer are disposed between the first conductive layer and the second conductive layer. The intermediate layer is disposed between the phase change layer and the selector layer, wherein a smallest width of the intermediate layer is wider than a smallest width of the phase change layer or a smallest width of the selector layer.

In accordance with yet other embodiments of the present disclosure, a method of forming a memory device includes the following operations. A first conductive layer, a selector layer, an intermediate layer, a phase change layer, a second conductive layer and a mask layer are sequentially on a substrate. The second conductive layer is patterned by using the mask layer as a mask. The phase change layer is patterned by using the mask layer as a mask, wherein the patterning includes a chemical etching, and the remaining phase change layer has a recessed sidewall. The intermediate layer is patterned by using the mask layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate;
   a first conductive layer disposed over the substrate;
   a second conductive layer disposed over the first conductive layer; and
   a memory layer and a selector layer disposed between the first conductive layer and the second conductive layer,
   wherein the selector layer has a continuously varied sidewall profile with a concave cross-section.

2. The memory device of claim 1, wherein the continuously varied sidewall profile is a narrow-middle profile that comprises a middle portion narrower than a top portion and a bottom portion of the selector layer.

3. The memory device of claim 1, wherein a projection area of the second conductive layer on the substrate is substantially equal to or greater than a projection area of the memory layer on the substrate.

4. The memory device of claim 1, further comprising a first intermediate layer between the selector layer and the first conductive layer.

5. The memory device of claim 4, wherein the first intermediate layer comprises tungsten (W), graphene, $MoS_2$, carbon (C), titanium (Ti), tantalum (Ta), tungsten nitride (WN), titanium nitride (TiN), tantalum nitride (TaN) or a combination thereof.

6. The memory device of claim 1, further comprising a second intermediate layer between the memory layer and the selector layer.

7. The memory device of claim 6, wherein the second intermediate layer comprises tungsten (W), graphene, $MoS_2$, carbon (C), titanium (Ti), tantalum (Ta), tungsten nitride (WN), titanium nitride (TiN), tantalum nitride (TaN) or a combination thereof.

8. The memory device of claim 1, further comprising a third intermediate layer between the memory layer and the second conductive layer.

9. The memory device of claim 8, wherein the third intermediate layer comprises tungsten (W), graphene, $MoS_2$, carbon (C), titanium (Ti), tantalum (Ta), tungsten nitride (WN), titanium nitride (TiN), tantalum nitride (TaN) or a combination thereof.

10. The memory device of claim 1, further comprising:
    a dielectric layer disposed aside the memory layer and the selector layer; and
    a liner layer disposed between the dielectric layer and each of the memory layer and the selector layer.

11. A memory device, comprising:
    a substrate;
    a first conductive layer disposed over the substrate;
    a memory layer disposed over the first conductive layer;
    a selector layer disposed between the memory layer and the first conductive layer; and
    a second conductive layer disposed over the memory layer,
    wherein at least one of the memory layer and the selector layer has a smooth and recessed sidewall profile without a turning point.

12. The memory device of claim 11, wherein a top width of the memory layer is recessed from a bottom width of the second conductive layer by a distance greater than zero.

13. The memory device of claim 12, wherein the distance is from about 1 nm to 5 nm.

14. The memory device of claim 11, wherein a bottom width of the selector layer is recessed from a top width of the first conductive layer by a distance greater than zero.

15. The memory device of claim 14, wherein the distance is from about 1 nm to 5 nm.

16. The memory device of claim 11, further comprising an intermediate layer disposed between the memory layer and the selector layer, and the intermediate layer has a profile different from the smooth and recessed sidewall profile of the least one of the memory layer and the selector layer.

17. A method of forming a memory device, comprising:
    forming a first conductive layer on a substrate;
    forming a second conductive layer over the first conductive layer; and
    forming a memory layer and a selector layer between the first conductive layer and the second conductive layer,
    wherein the selector layer has a continuously varied sidewall profile with a concave cross-section.

18. The method of claim 17, further comprising performing a first lateral trimming process to the memory layer, wherein after the first lateral trimming process, a top width of the memory layer is recessed from a bottom width of the second conductive layer by a distance greater than zero.

19. The method of claim 17, further comprising performing a second lateral trimming process to the selector layer, wherein after the second lateral trimming process, the selector layer is trimmed to have a narrow-middle profile that comprises a middle portion narrower than a top portion and a bottom portion of the selector layer.

20. The method of claim 19, wherein after the second lateral trimming process, a bottom width of the selector layer is recessed from a top width of the first conductive layer by a distance greater than zero.

* * * * *